(12) United States Patent
Schmidt-Lange et al.

(10) Patent No.: US 9,425,163 B2
(45) Date of Patent: Aug. 23, 2016

(54) SYSTEMS AND METHODS FOR DETERMINING AND ADJUSTING A LEVEL OF PARALLELISM RELATED TO BONDING OF SEMICONDUCTOR ELEMENTS

(71) Applicant: Kulicke and Soffa Industries, Inc., Fort Washington, PA (US)

(72) Inventors: Michael P. Schmidt-Lange, North Wales, PA (US); Matthew B. Wasserman, Philadelphia, PA (US); Christopher W. Braun, Lafayette Hill, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 14/821,312

(22) Filed: Aug. 7, 2015

(65) Prior Publication Data

US 2015/0380380 A1 Dec. 31, 2015

Related U.S. Application Data

(62) Division of application No. 14/553,782, filed on Nov. 25, 2014, now Pat. No. 9,136,243.

(60) Provisional application No. 61/911,011, filed on Dec. 3, 2013, provisional application No. 61/916,930, filed on Dec. 17, 2013.

(51) Int. Cl.
*B23K 31/02* (2006.01)
*B23K 37/00* (2006.01)
(Continued)

(52) U.S. Cl.
CPC ............. *H01L 24/75* (2013.01); *B23K 1/0016* (2013.01); *B23K 31/12* (2013.01); *B23K 37/04* (2013.01); *H01L 24/81* (2013.01); *H01L 2224/131* (2013.01); *H01L 2224/13147* (2013.01); *H01L 2224/16238* (2013.01); *H01L 2224/75001* (2013.01); *H01L 2224/7501* (2013.01);
(Continued)

(58) Field of Classification Search
CPC ............... B23K 1/0016; B23K 31/12; B23K 2201/36–2201/42; B23K 37/00; B23K 37/04–37/0461
USPC ...... 228/102–105, 33, 44.7, 8–12, 49.5, 4.1, 228/6.2
See application file for complete search history.

(56) References Cited

U.S. PATENT DOCUMENTS 4,818,169 A * 4/1989 Schram .............. G02B 21/0016 118/729
5,579,980 A * 12/1996 Ichikawa ........... H05K 13/0408 228/49.5

(Continued)

FOREIGN PATENT DOCUMENTS

JP 3276537 B2 * 4/2002 ............. H01L 24/78
WO WO 0243133 A1 * 5/2002 ........... H01L 23/544

*Primary Examiner* — Kiley Stoner
(74) *Attorney, Agent, or Firm* — Stradley Ronon Stevens & Young, LLP

(57) ABSTRACT

A bonding machine for bonding semiconductor elements, the bonding machine including: a support structure configured to support a substrate; a bond head assembly, the bond head assembly including a bonding tool configured to bond a plurality of semiconductor elements to the substrate; and a calibration tool including a contact portion configured to be positioned between the bonding tool and the support structure, the contact portion configured to be contacted by each of the bonding tool and the support structure simultaneously during a calibration operation.

24 Claims, 9 Drawing Sheets

(51) Int. Cl.
*H01L 23/00* (2006.01)
*B23K 1/00* (2006.01)
*B23K 37/04* (2006.01)
*B23K 31/12* (2006.01)

(52) U.S. Cl.
CPC ............ *H01L2224/75252* (2013.01); *H01L 2224/75753* (2013.01); *H01L 2224/75804* (2013.01); *H01L 2224/75824* (2013.01); *H01L 2224/81011* (2013.01); *H01L 2224/81191* (2013.01); *H01L 2224/81203* (2013.01); *H01L 2224/81815* (2013.01)

(56) References Cited

U.S. PATENT DOCUMENTS

| | | | | |
|---|---|---|---|---|
| 6,150,832 | A * | 11/2000 | Mazur | H01L 22/14 257/E21.531 |
| 6,166,386 | A * | 12/2000 | Yano | B82Y 10/00 250/492.2 |
| 6,337,489 | B1 * | 1/2002 | Matsumoto | H01L 21/67144 228/105 |
| 6,564,115 | B1 * | 5/2003 | Kinnaird | H01L 24/05 219/56.1 |
| 7,303,111 | B2 | 12/2007 | Gaunekar et al. | |
| 7,861,913 | B2 | 1/2011 | Miyazaki | |
| 8,309,922 | B2 * | 11/2012 | Ando | H01J 37/244 250/306 |
| 8,950,650 | B2 * | 2/2015 | Okada | B23K 20/1245 228/102 |
| 9,377,698 | * | 6/2016 | Shibazaki | H01L 21/68 |
| 9,379,082 | * | 6/2016 | Yamauchi | H01L 24/75 |
| 2002/0066767 | A1 | 6/2002 | Takahashi et al. | |
| 2002/0092887 | A1 | 7/2002 | Hosotani et al. | |
| 2002/0106972 | A1 * | 8/2002 | Lebel | H01L 21/681 451/5 |
| 2003/0071631 | A1 * | 4/2003 | Alexander | G01R 31/2831 324/500 |
| 2003/0106210 | A1 * | 6/2003 | Arai | H05K 13/08 29/833 |
| 2003/0123866 | A1 * | 7/2003 | Hayata | G03B 17/00 396/80 |
| 2003/0136523 | A1 | 7/2003 | Takahashi et al. | |
| 2004/0211812 | A1 | 10/2004 | Hizukuri et al. | |
| 2005/0071991 | A1 | 4/2005 | Yonezawa et al. | |
| 2006/0157537 | A1 | 7/2006 | Walther | |
| 2006/0208033 | A1 | 9/2006 | Welter | |
| 2006/0244155 | A1 | 11/2006 | Niizuma | |
| 2007/0107827 | A1 | 5/2007 | Takahashi et al. | |
| 2007/0159615 | A1 * | 7/2007 | Horiuchi | G03F 7/7075 355/72 |
| 2007/0287226 | A1 | 12/2007 | Oga et al. | |
| 2008/0029763 | A1 * | 2/2008 | Kasukabe | G01R 31/2889 257/48 |
| 2008/0070480 | A1 * | 3/2008 | Nomiya | B24B 37/013 451/22 |
| 2008/0123067 | A1 * | 5/2008 | Yoda | G03F 7/70341 355/30 |
| 2009/0014501 | A1 | 1/2009 | Nishi et al. | |
| 2009/0127315 | A1 | 5/2009 | Okita | |
| 2010/0000081 | A1 | 1/2010 | Noda | |
| 2010/0038406 | A1 | 2/2010 | Masuda et al. | |
| 2010/0074722 | A1 | 3/2010 | Noda | |
| 2010/0175759 | A1 * | 7/2010 | Ikushima | G02F 1/1303 137/15.01 |
| 2010/0242268 | A1 * | 9/2010 | Hiraki | H01L 21/67126 29/739 |
| 2010/0297562 | A1 * | 11/2010 | Shibazaki | G03F 7/70691 430/325 |
| 2011/0011536 | A1 * | 1/2011 | Tsuno | H01L 21/67092 156/362 |
| 2011/0036897 | A1 | 2/2011 | Nakai | |
| 2011/0114704 | A1 * | 5/2011 | Sugawara | B23K 20/007 228/102 |
| 2011/0214282 | A1 * | 9/2011 | Choy | B25J 11/00 29/740 |
| 2012/0043005 | A1 | 2/2012 | Yamakami et al. | |
| 2012/0060356 | A1 | 3/2012 | Harada et al. | |
| 2012/0127485 | A1 * | 5/2012 | Yamauchi | H01L 24/75 356/614 |
| 2012/0228364 | A1 | 9/2012 | Vegelahn | |
| 2012/0298636 | A1 | 11/2012 | Nomaru et al. | |
| 2012/0317804 | A1 * | 12/2012 | Endo | H05K 13/0413 29/832 |
| 2013/0181037 | A1 | 7/2013 | Nagai et al. | |
| 2013/0276989 | A1 | 10/2013 | Okubo et al. | |
| 2013/0340943 | A1 * | 12/2013 | Yoshida | H01L 24/74 156/380.9 |
| 2014/0069588 | A1 * | 3/2014 | Hirakawa | B32B 43/006 156/750 |
| 2014/0076497 | A1 * | 3/2014 | Honda | H01L 21/67092 156/701 |
| 2014/0076500 | A1 * | 3/2014 | Honda | H01L 21/67092 156/750 |
| 2014/0102322 | A1 | 4/2014 | Tomomatsu et al. | |
| 2014/0169924 | A1 | 6/2014 | Golda et al. | |
| 2014/0175159 | A1 * | 6/2014 | Kostner | H01L 24/81 228/102 |
| 2014/0311652 | A1 | 10/2014 | Kostner et al. | |
| 2014/0352141 | A1 | 12/2014 | Yasuyoshi | |
| 2015/0090770 | A1 | 4/2015 | Mantani et al. | |
| 2015/0096651 | A1 | 4/2015 | Kojio et al. | |
| 2015/0099235 | A1 * | 4/2015 | Watanabe | H01L 21/67109 432/45 |
| 2015/0155254 | A1 * | 6/2015 | Schmidt-Lange | B23K 1/0016 228/4.1 |
| 2015/0171049 | A1 * | 6/2015 | Wasserman | B23K 3/04 228/104 |
| 2015/0255421 | A1 * | 9/2015 | Hirose | G01N 3/02 438/15 |
| 2015/0371881 | A1 * | 12/2015 | Du Bois | H01L 21/67248 374/141 |
| 2016/0027696 | A1 * | 1/2016 | Nagaoka | H01L 21/6835 438/14 |
| 2016/0043053 | A1 * | 2/2016 | Seyama | H01L 24/75 228/265 |
| 2016/0158866 | A1 * | 6/2016 | Zaffino | B23K 9/0953 219/124.34 |

* cited by examiner

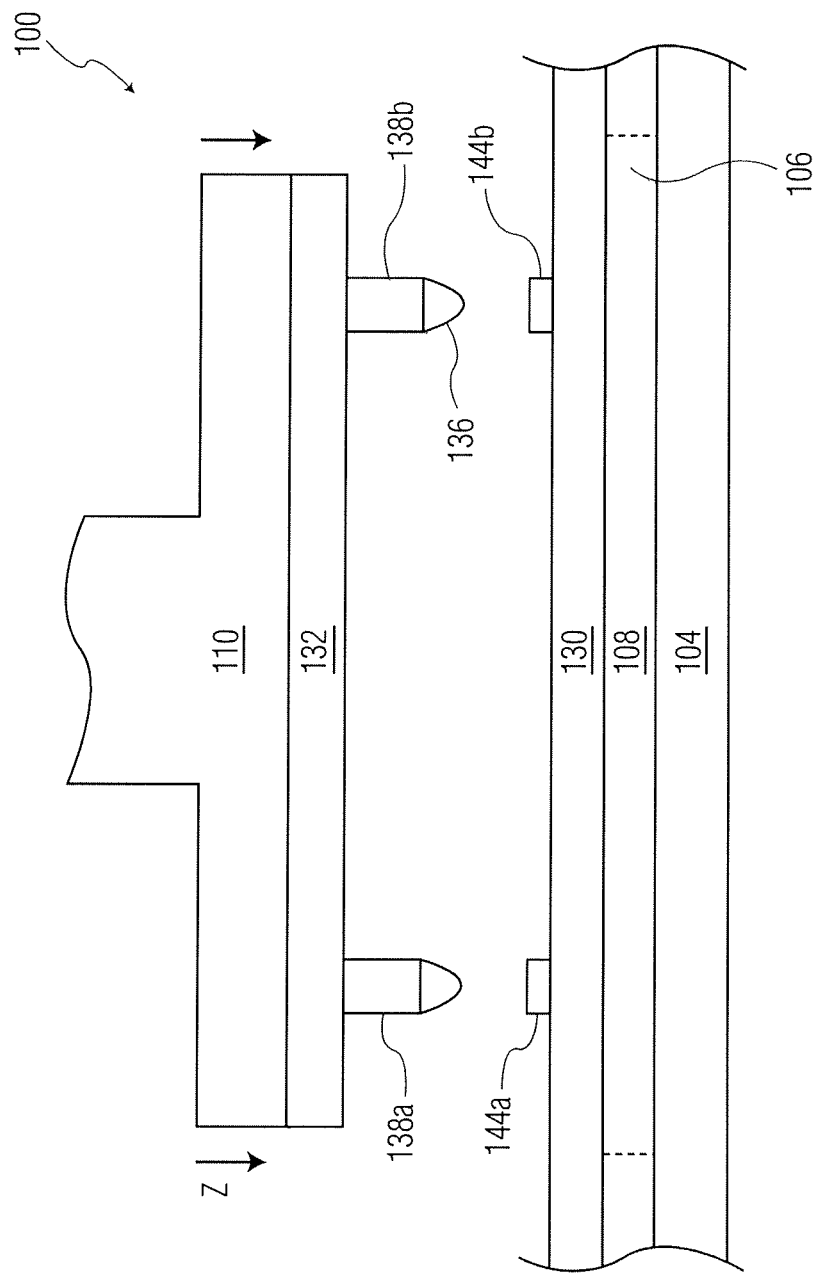

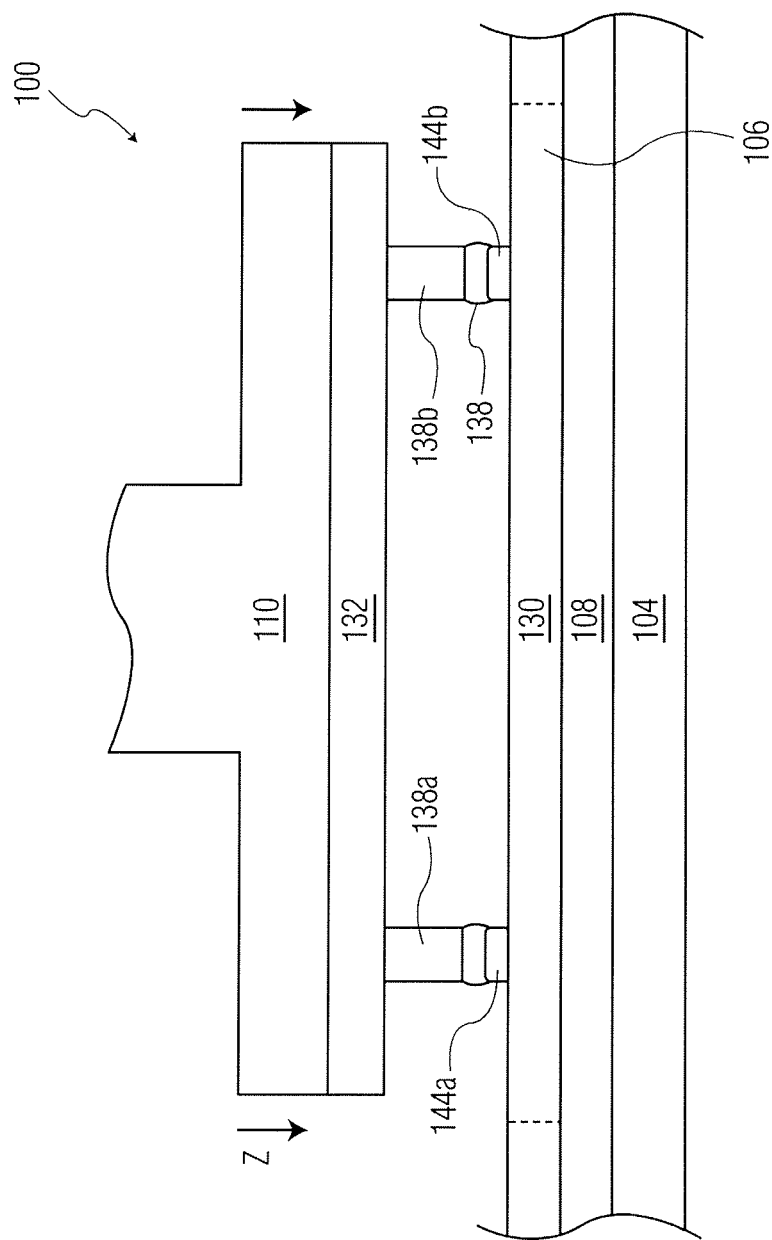

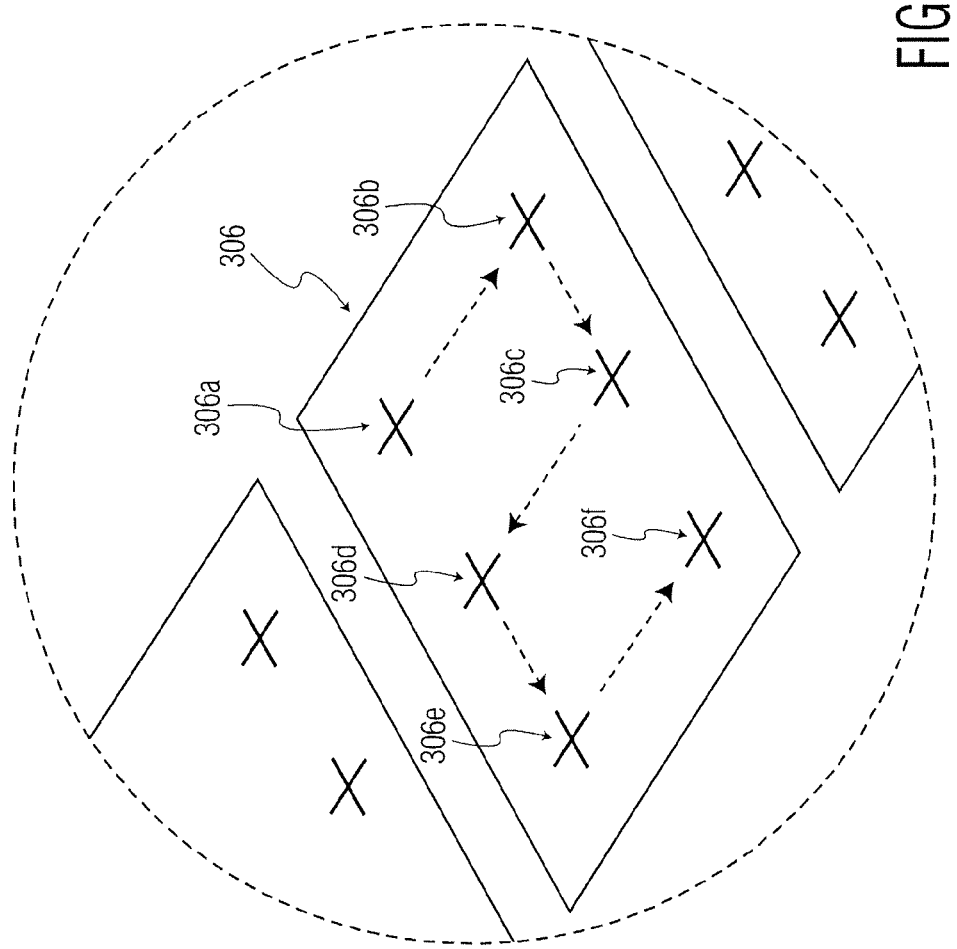

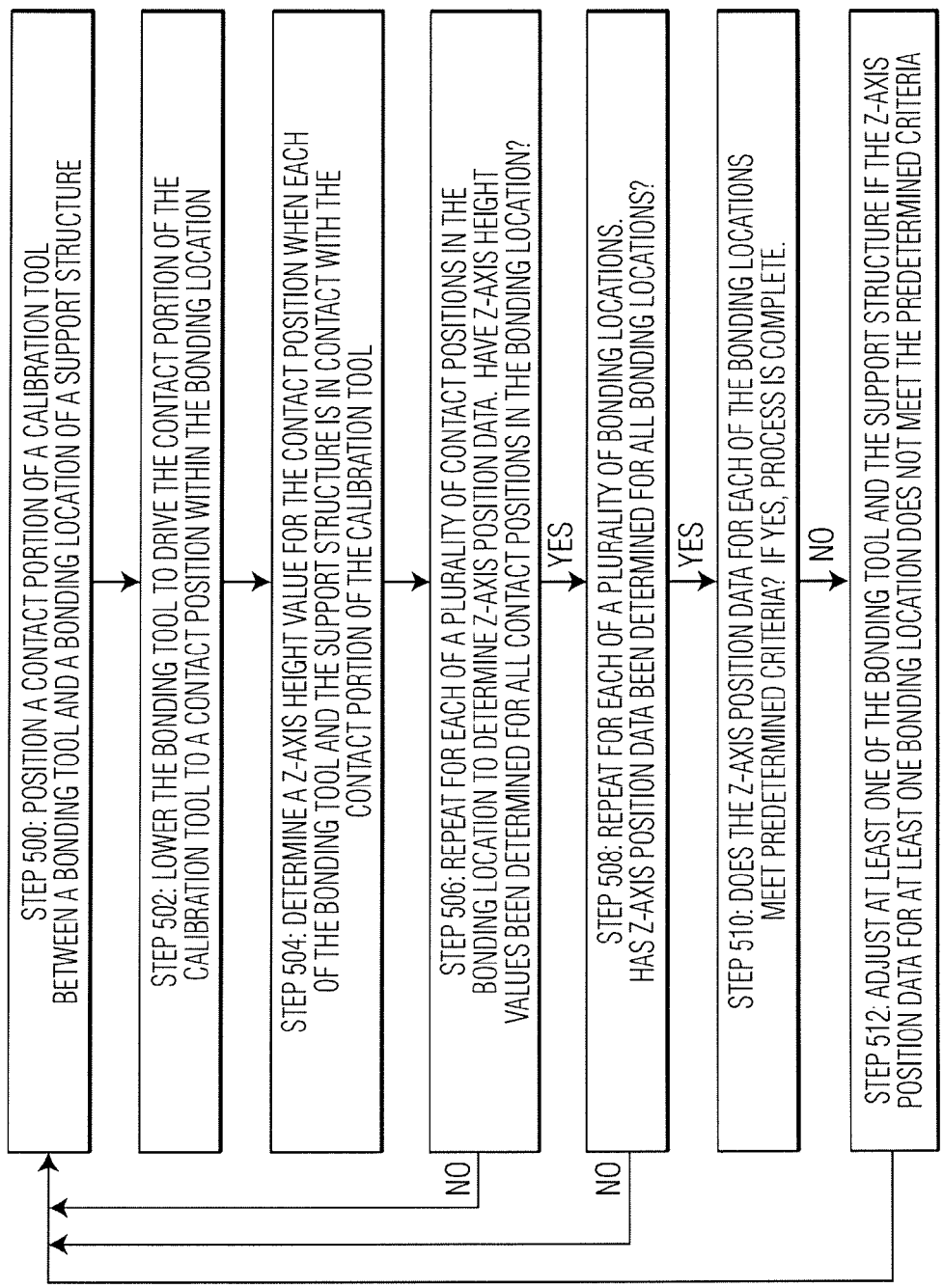

SYSTEMS AND METHODS FOR DETERMINING AND ADJUSTING A LEVEL OF PARALLELISM RELATED TO BONDING OF SEMICONDUCTOR ELEMENTS

CROSS REFERENCE TO RELATED APPLICATIONS

This application is a divisional application of application Ser. No. 14/553,782 filed Nov. 25, 2014, which claims the benefit of U.S. Provisional Patent Application No. 61/911,011 filed Dec. 3, 2013, and U.S. Provisional Patent Application No. 61/916,930 filed Dec. 17, 2013, the content of all of which is incorporated herein by reference.

FIELD OF THE INVENTION

The present invention relates to the formation of semiconductor packages, and more particularly, to improved systems and methods for bonding semiconductor elements together.

BACKGROUND OF THE INVENTION

In certain aspects of the semiconductor packaging industry, semiconductor elements are bonded to bonding locations. For example, in conventional die attach (also known as die bonding) applications, a semiconductor die is bonded to a bonding location (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, etc.), with conductive structures (e.g., conductive bumps, contact pads, solder bumps, conductive pillars, copper pillars, etc.) providing electrical interconnection between the semiconductor element and the bonding location.

In many applications (e.g., thermocompression bonding of semiconductor elements including solder bumps, etc.) it is particularly desirable to have a significant level of parallelism between the bonding tool and respective portions of a support structure of the bonding machine. For example, there may be many interconnections between (1) the semiconductor element being bonded by the bonding tool, and (2) the substrate supported by the support structure. These interconnections may include solder or the like, and as such, it is particularly desirable that there be substantial parallelism between the contact portion of the bonding tool and respective portions of the support structure.

Thus, it would be desirable to provide improved systems for, and methods of, determining and adjusting the parallelism between elements of bonding machine.

SUMMARY OF THE INVENTION

According to an exemplary embodiment of the present invention, a bonding machine for bonding semiconductor elements is provided. The bonding machine includes: a support structure configured to support a substrate; a bond head assembly including a bonding tool configured to bond a plurality of semiconductor elements to the substrate; and a calibration tool including a contact portion configured to be positioned between the bonding tool and the support structure, the contact portion configured to be contacted by each of the bonding tool and the support structure simultaneously during a calibration operation.

According to another exemplary embodiment of the present invention, a method of determining a level of parallelism between a bonding tool and a support structure of a bonding machine is provided. The method includes the steps of: (a) positioning a contact portion of a calibration tool between the bonding tool and the support structure; (b) lowering the bonding tool to drive the contact portion of the calibration tool to a contact position within a bonding location of the support structure where the contact portion of the calibration tool contacts the bonding tool and the contact position simultaneously; and (c) determining a z-axis height value for the contact position when each of the bonding tool and the support structure is in contact with the contact portion of the calibration tool.

According to another exemplary embodiment of the present invention, a method of determining a level of parallelism between a contact portion of a bonding tool and a contact region of a flux station of a bonding machine is provided. The method includes the steps of: (a) positioning a contact portion of a calibration tool between the bonding tool and the contact region of the flux station; (b) lowering the bonding tool to drive the contact portion of the calibration tool to a contact position within the contact region of the flux station where the contact portion of the calibration tool contacts the contact portion of the bonding tool and the contact position within the contact region of the flux station simultaneously; and determining a z-axis height value for the contact position within the contact region of the flux station when each of the contact portion of the bonding tool and the contact region of the flux station is in contact with the contact portion of the calibration tool.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 1A is a block diagram side view illustrating a semiconductor element carried by a bonding tool prior to bonding to a substrate;

FIG. 1B illustrates the semiconductor element of FIG. 1A after bonding to the substrate;

FIG. 4A is an detailed block diagram perspective view of a bonding location of a substrate of FIG. 3 in accordance with an exemplary embodiment of the present invention;

FIG. 5 is a flow diagram illustrating a method of determining a level of parallelism between a bonding tool and a support structure of a bonding machine in accordance with an exemplary embodiment of the present invention;

DETAILED DESCRIPTION OF THE INVENTION

Figure 2:
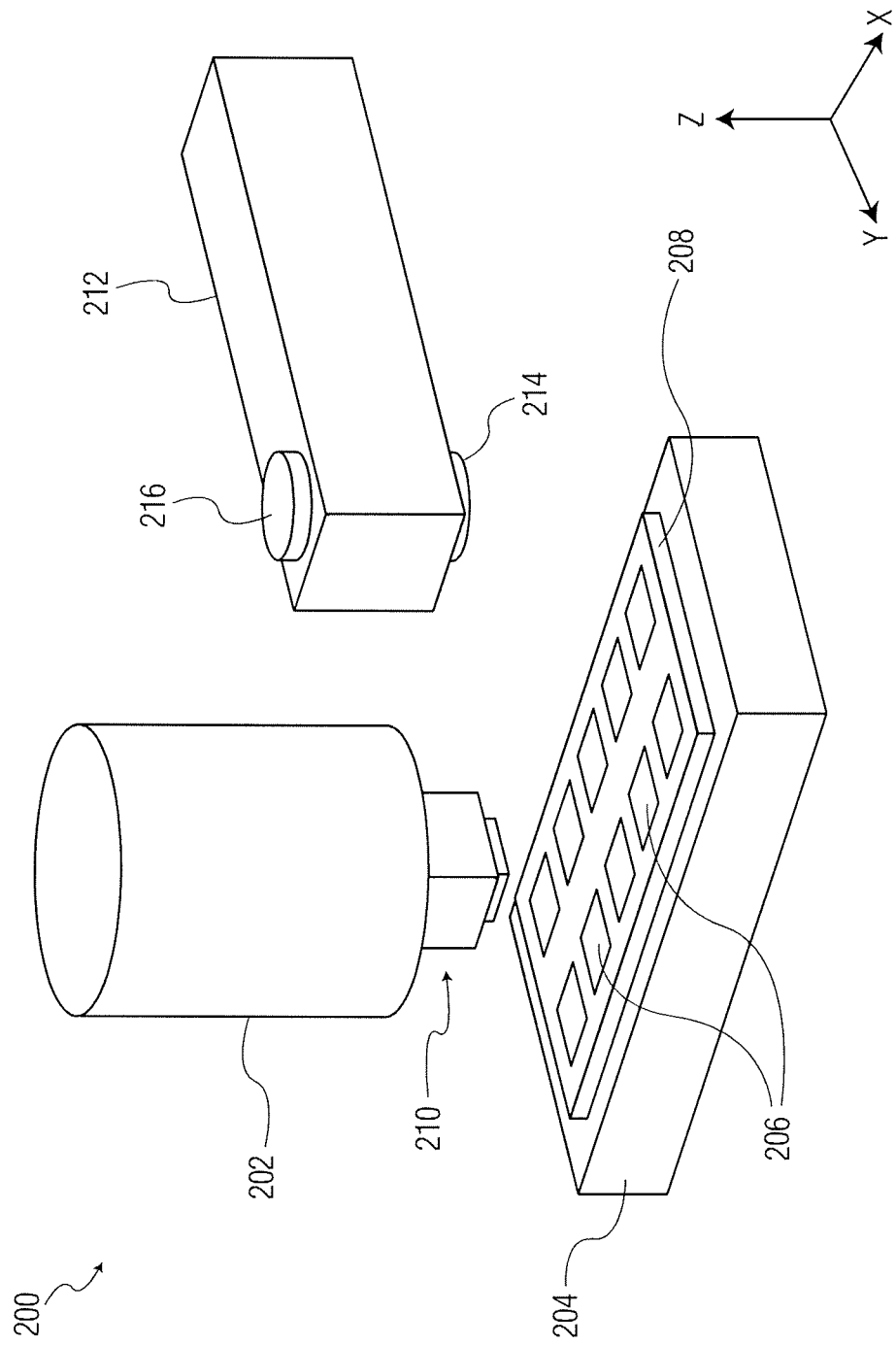
FIG. 2 is a block diagram perspective view of elements of a bonding machine in accordance with an exemplary embodiment of the present invention.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor wafer, a BGA substrate, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded (e.g., thermocompressively bonded, ultrasonically bonded, thermosonically bonded, die bonded, etc.). Exemplary substrates include, for example, a leadframe, a PCB, a carrier, a semicondcutor wafer, a BGA substrate, a semiconductor element, etc.

In accordance with certain exemplary embodiments of the present invention, a thermocompression flip chip bonding machine includes a bond head assembly carrying a bonding tool. The bonding tool places and bonds a semiconductor element (e.g., a semiconductor die, an interposer, etc.) to a substrate by melting and re-solidifying solder bumps on the semiconductor element being placed to create solder bonds. Controlling the height of the finished solder bonds is a desirable process control objective. In this embodiment, because all of the solder bumps on the semiconductor element are bonded at one time, the variation in the resulting solder bond height across the semiconductor element depends directly on the parallelism of the semiconductor element being bonded and the target substrate. In terms of the bonding machine, it is desirable to control the parallelism between the bonding tool (e.g., a contact portion/ contact surface of the bonding tool) and the support structure (which may also be referred to as the bonding stage) of the bonding machine. The desired window for parallelism (or coplanarity) across the substrate may be very narrow (e.g., a variation of 2-3 microns across the substrate). Therefore, very accurate alignment of the bonding tool and the support structure is desired.

According to certain exemplary embodiments, the present invention relates to a method of determining (e.g., measuring) a level of parallelism between the bonding tool and the support structure, for example, in order to verify that the calibration has been successful, so that bonding can proceed with confidence in achieving the desired bond height control. Further, the determination of the level of parallelism may be used to generate a desired correction motion/adjustment for the bonding tool (e.g., using an active/passive tilt control mechanism in the bonding tool) and/or the support structure.

As will be appreciated by those skilled in the art, bonding machines have differing motion system architectures. In the present application, much of the description relates to a specific architecture (with certain elements having certain motion axes); however, it is understood that the present invention is not limited to such an architecture. As will be explained in greater detail below with respect to the drawings, the exemplary architecture includes: (1) a support structure that is moveable along an x-axis direction; (2) a bond head assembly (carrying a bonding tool) that is moveable along a y-axis direction, a z-axis direction, and about a theta axis; and a secondary motion system (e.g., an optical assembly motion system) that is moveable along an x-axis direction, a y-axis direction, and a z-axis direction. The secondary motion system is configured to carry a calibration tool (e.g., including a beam portion compliant in the z-axis direction, and a contact portion having 2 spherically shaped contact surfaces/portions), and can position the contact portion of the calibration tool between the bonding tool and the support structure. The bonding tool is lowered along the z-axis until it makes contact with the calibration tool, and continues until the calibration tool contacts the support structure. After contact is made between the calibration tool and the support structure, the position of a z-axis position encoder (e.g., on the bond head assembly or another portion of the bonding machine) is recorded. This position measurement may be repeated at several x, y locations within a bonding location of the support structure (e.g., through motion of the secondary motion system). The set of measurements allows the creation of a data set of z-axis data at a plurality of x, y coordinate locations within the bonding location, which provides an indication of the parallelism/ planarity error between the bonding tool and the bonding location of the support structure. The position measurement may also be repeated for each of the bonding locations on the support structure by moving the support structure and/or the bond head assembly along the x, y axes, respectively, to the various bonding locations. Further, such methods may also be used to measure the parallelism between the bonding tool and an optional fluxing station. Further still, such methods may also be used to measure the flatness of the support structure.

The techniques described above may also be used in connection with adjustment/calibration processes. For example, z-axis position data provided for a plurality of bonding locations of a support structure (where the z-axis position data for each bonding location may include z-axis height values for a plurality of positions within each bonding location) may be used to adjust at least one of the bonding tool and the support structure to improve the relative parallelism therebetween. Likewise, z-axis position data provided for a plurality of x-axis and y-axis locations within a contact region of a flux station may be used to adjust the flux station to improve the parallelism between the flux station and the bonding tool.

As will be appreciated by those skilled in the art, bonding machines (such as machines 100, 200, 300, and 300*a* illustrated and described herein) may include many elements not shown in the drawings herein for simplicity. Exemplary elements include, for example: input elements for providing input substrates/workpieces to be bonded with semiconductor elements; output elements for receiving processed substrates/workpieces that now include additional semiconductor elements; transport systems for moving substrates; semiconductor element supply structures (e.g., semiconductor wafers) including a plurality of semiconductor elements to be bonded to one or more substrates; a computer system including software for operating the machine; amongst other elements.

Referring now to the drawings, FIG. 1A illustrates portions of bonding machine 100 (e.g., a thermocompressive flip chip bonding machine) including bond stage 104 (e.g., a shuttle, a heated shuttle, a heat block, an anvil, etc.), and support structure 108 supported by bond stage 104 (where support structure 108 and bond stage 104 may be integrated into a single element). As will be appreciated by those skilled in the art, support structure 108 (e.g., an application specific part, sometimes referred to in the industry as a p-part) includes a plurality of bonding locations 106. Substrate 130 is supported by support structure 108, and includes a plurality of bonding areas (corresponding to bonding locations 106 of support structure 108). Lower conductive structures 144a, 144b (e.g., conductive traces, conductive pads, etc.) are provided on substrate 130. Bonding machine 100 also includes bonding tool 110 (e.g., carried by a bond head assembly, not shown) carrying semiconductor element 132. Upper conductive structures 138a, 138b (e.g., conductive pillars such as copper pillars, shown including solder contact portions 136 or solder bumps 136) are provided on semiconductor element 132. Bonding tool 110 is lowered such that upper conductive structures 138a, 138b contact lower conductive structures 144a, 144b (e.g., see FIG. 1B). As illustrated in FIG. 1B, through a bonding process (e.g., a thermocompressive bonding process) solder contact portions 136 are melted, and then re-solidified as solder interfaces 138, providing a permanent conductive coupling between ones of upper conductive structures 138a, 138b and lower conductive structures 144a, 144b. Although FIGS. 1A-1B illustrate only two pairs of conductive structures (pair 138a, 144a and pair 138b, 144b), this is of course a simple example for ease of explanation. In practice, any number of pairs of conductive structures may be provided (e.g., tens of conductive structure pairs, hundreds of conductive structure pairs, etc.).

FIG. 2 illustrates elements of bonding machine 200 including bond stage 204 carrying support structure 208 (where support structure 208 includes a plurality of bonding locations 206), where bond stage 204 (along with support structure 208) is configured to travel along an x-axis range of motion. Bonding machine 200 also includes bond head assembly 202 carrying bonding tool 210. Bond head assembly 202 (along with bonding tool 210) is configured to travel along a y-axis range of motion, along a z-axis range of motion, and about a theta (θ) axis. Motion system 212 is also provided, and is configured to travel along an x-axis range of motion and a y-axis range of motion (independent of the x-axis range of motion of bond stage 204, and independent of the y-axis range of motion of bond head assembly 202). In FIG. 2, motion system 212 is a motion system of an optical assembly of bonding machine 200 carrying look-up camera 216 and look-down camera 214. In an exemplary bonding operation, a pick tool (not shown) removes a semiconductor element (e.g., a bare die) from a wafer (or other semiconductor element source). The pick tool, with the semiconductor element, moves (e.g., along an x-axis range of motion) to a transfer position (not shown). Bond head assembly 202 also moves to the transfer position, where the semiconductor element is transferred from the pick tool to bonding tool 210. Support structure 208 is aligned in a given position along its x-axis range of motion. Bond head assembly 202 moves along its y-axis range of motion to a position above a bonding location of a substrate (not shown) supported by support structure 208. Bond head assembly 202 is lowered along its z-axis range of motion such that bonding tool 210 is able to bond the semiconductor element to the bonding location of the substrate. This process may be repeated such that a number of semiconductor elements from semiconductor element source (not shown) may be bonded to respective bonding locations on the substrate. In connection with this bonding process, an imaging system (e.g., including cameras 214 and 216) is configured for use in determining proper placement and alignment of the semiconductor elements to respective bonding locations on the substrate. For example, look-up camera 216 may be used to image a semiconductor element carried by bonding tool 210, and look-down camera 214 may be used to image a bonding location of the substrate.

Unless provided otherwise, elements in drawings other than FIG. 2, but having similar reference numerals as those shown and described above with respect to FIG. 2 (e.g., numerals that are the same except the first numeral, such as bonding tool 210 and bonding tool 310), are substantially the same element. Likewise, the exemplary bonding operation described above with respect to FIG. 2 also applies to the subsequent drawings and embodiments of the present invention.

Figure 3:
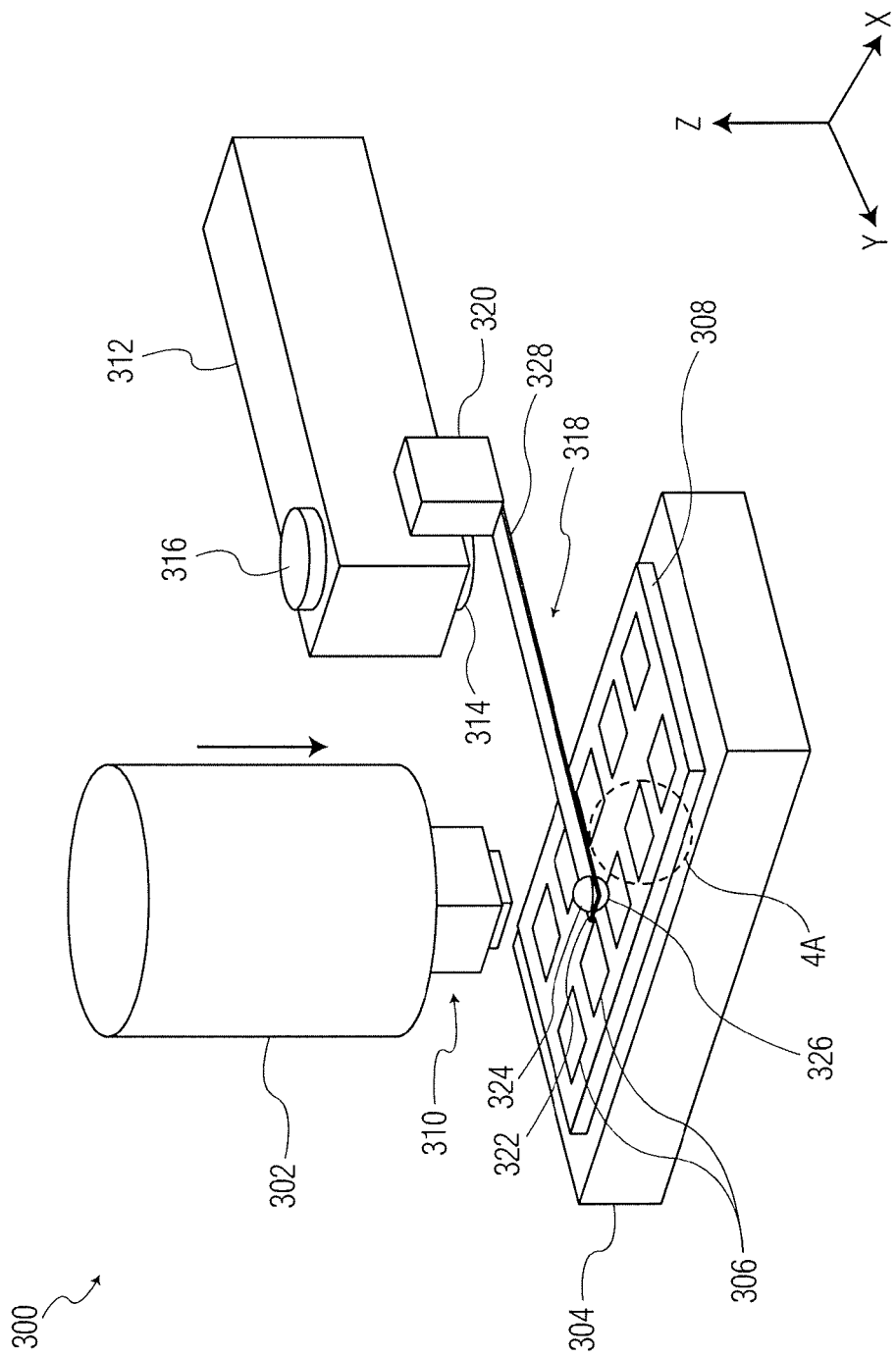
FIG. 3 is a block diagram perspective view of elements of another bonding machine in accordance with another exemplary embodiment of the present invention.

FIG. 3 illustrates elements of bonding machine 300 including bond stage 304 carrying support structure 308 (including bonding locations 306), where bond stage 304 (along with support structure 308) is configured to travel along an x-axis range of motion. Bonding machine 300 also includes bond head assembly 302 carrying bonding tool 310. Bond head assembly 302 (along with bonding tool 310) is configured to travel along a y-axis range of motion, along a z-axis range of motion, and about a theta (θ) axis. Motion system 312 is also provided, and is configured to travel along an x-axis range of motion and a y-axis range of motion. Motion system 312 is a motion system of an optical assembly of bonding machine 300 carrying look-up camera 316 and look-down camera 314. Bonding machine 300 also includes calibration tool 318 carried by motion system 312 (and coupled to motion system 312 through tool attachment bracket 320). Calibration tool 318 includes arm portion 328 that supports contact portion 322. Arm portion 328 may be, for example, a compliant beam portion configured to be compliant in a z-axis direction, and configured to support contact portion 322 of calibration tool 318. Contact portion 322 includes upper contact portion 324 and lower contact portion 326. Upper contact portion 324 and lower contact portion 326 are opposing contact portions each of which defines respective spherical surfaces, where such contact portions may be formed of a hard material (e.g., a hard metallic material). That is, each of contact portions 324, 326 has a spherical contact surface—where the spherical contact surface may be a portion of a spherically shaped contact portion (as shown in FIG. 3), or may be a full sphere ball-shaped contact portion. As will be explained in greater detail below—when calibration tool 318 is in a desired position between bonding tool 310 and support structure 308, bonding tool 310 is lowered along the z-axis until it contacts upper contact portion 324 and then continues downward, driving lower contact portion 326 into contact with a contact region of one of bonding locations 306 of support structure 308. While driving lower contact portion 326 downward, arm portion 328 is flexed and as such, arm portion 328 is desirably compliant in the z-axis direction. After contact is established between lower contact portion 326 and the contact region of bonding location 306, a z-axis height measurement is made, for example, using a z-axis encoder. Thus, a z-axis height value is established.

The z-axis height value measurement may be made for a plurality of the bonding locations 306 of support structure 308. Further, the z-axis height value may be made for a plurality of positions within each bonding location 306. A detail of the portion of FIG. 3 is shown in FIG. 4A.

Specifically, FIG. 4A illustrates a plurality of positions (i.e., positions 306a, 306b, 306c, 306d, 306e, and 306f—each marked with a cross-shaped marking) within one of the plurality of bonding locations 306. Thus, FIG. 4A illustrates an exemplary progression for determining z-axis height values for a plurality of positions within bonding location 306. That is, a z-axis height value is obtained at position 306a using contact portion 322 of calibration tool 318. Then, calibration tool 318 is moved and another z-axis height value is obtained at position 306b using contact portion 322. This process is repeated to obtain z-axis height values at positions 306c, 306d, 306e, and 306f. While FIG. 4A illustrates 6 positions within bonding location 306, it is understood that any number of positions (e.g., 10 positions, 50 positions, etc.) for obtaining z-axis height values may be utilized in each bonding location 306.

Figure 4D:
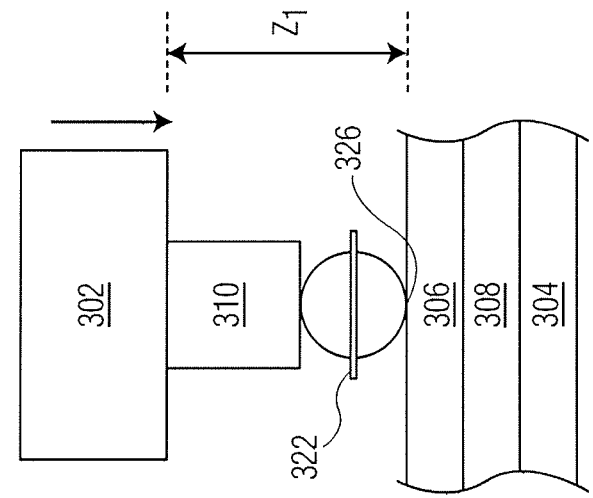
FIGS. 4B-4D are block diagram side views illustrating motion of a bonding tool and a calibration tool in connection with a calibration process in accordance with various exemplary embodiments of the present invention.
Figure 4C:
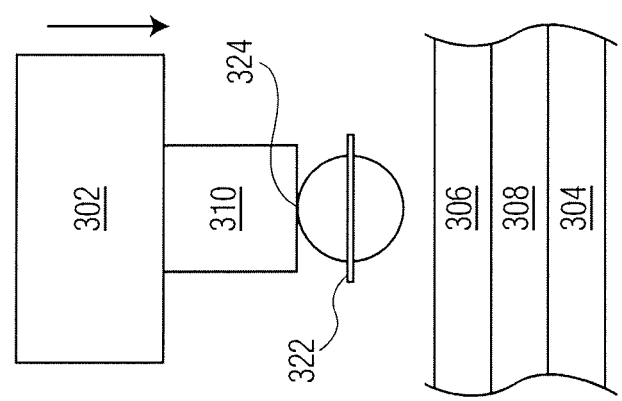
Figure 4B:
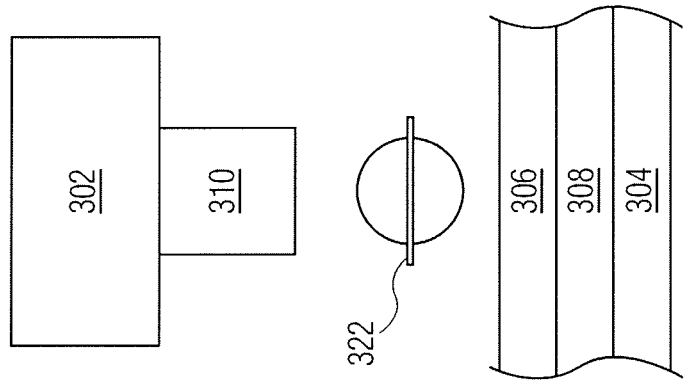

FIGS. 4B-4D illustrate an exemplary process of using bonding tool 310 to bring contact portion 322 (of calibration tool 318) into contact with bonding location 306 of support structure 308. More specifically, FIG. 4B illustrates contact portion 322 of calibration tool 318 after it has been positioned (e.g., moved along its x and/or y motion axes using motion system 312) between bonding tool 310 and support structure 308. FIG. 4C illustrates bonding tool 310 having been lowered to a position where its contacts upper contact portion 324 of contact portion 322. Bonding tool 310 continues to be lowered until, as shown in FIG. 4D, bonding tool 310 drives lower contact portion 326 of contact portion 322 to be in contact with bonding location 306 of support structure 308 (i.e., at a contact position, while contact portion 322 remains in contact with bonding tool 310. At this position, a z-axis height value is determined (e.g., using a z-axis encoder) for the contact position.

Figure 7:
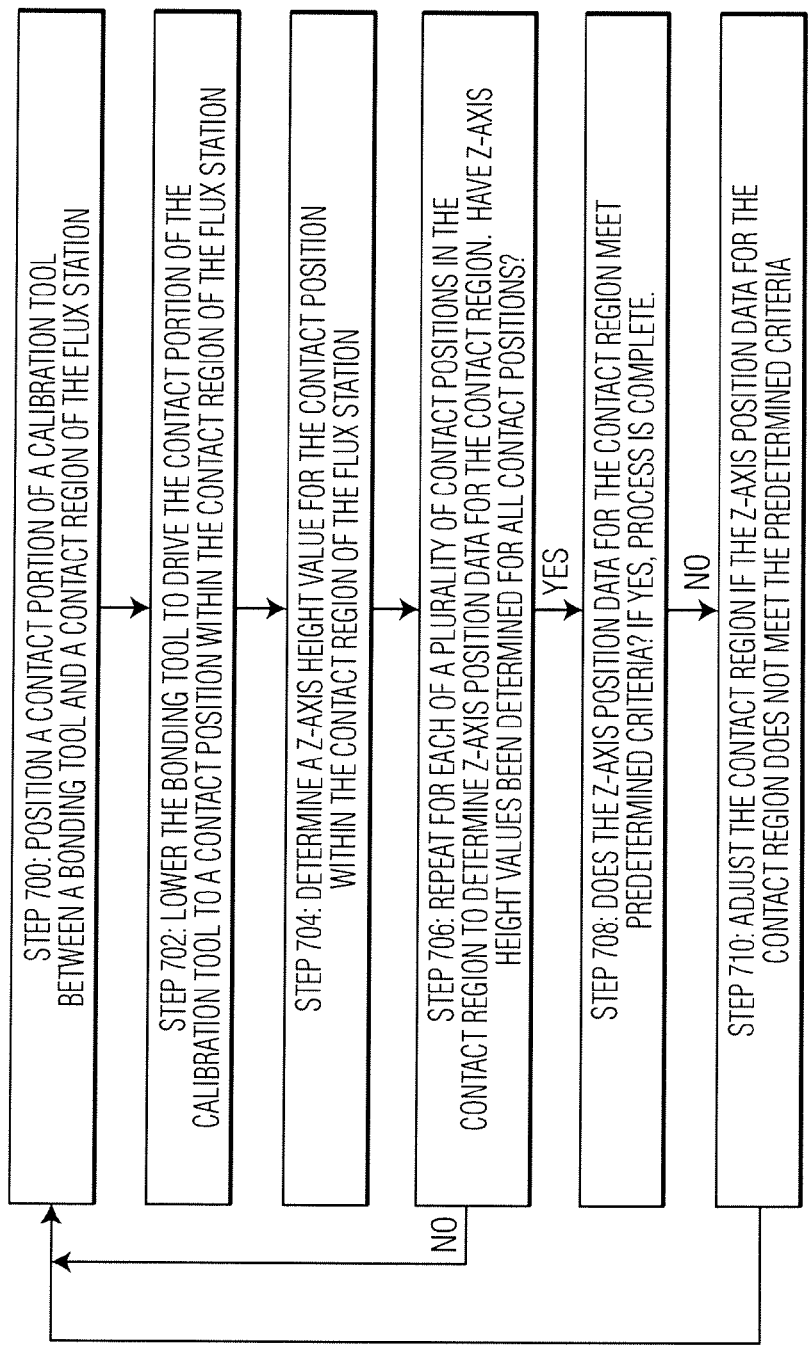
FIG. 7 is a flow diagram illustrating a method of determining a level of parallelism between a contact portion of a bonding tool and a contact region of a flux station of a bonding machine in accordance with an exemplary embodiment of the present invention.

FIGS. 5 and 7 are flow diagrams in accordance with exemplary embodiments of the present invention. As is understood by those skilled in the art, certain steps included in the flow diagrams may be omitted; certain additional steps may be added; and the order of the steps may be altered from the order illustrated.

FIG. 5 illustrates a method of determining a level of parallelism between a bonding tool (e.g., a contact portion of the bonding tool configured to contact a semiconductor element during bonding of the element to a substrate) and a support structure (supporting that substrate) of a bonding machine. At step 500, a contact portion of a calibration tool is positioned between the bonding tool and a bonding location of the support structure. For example, in FIG. 3, contact portion 322 has been positioned (using motion system 312, which travels along the x and y-axes, independent of bond head assembly) between bonding tool 310 and one bonding location 306 of support structure 308 (e.g., also see FIG. 4B). At step 502, the bonding tool is lowered to drive the contact portion of the calibration tool to a contact position within the bonding location. For example, see FIG. 4C-4D, where bonding tool 310 has driven contact portion 322 into contact with bonding location 306. At step 504, a z-axis height value is determined for the contact position when each of the bonding tool and the support structure is in contact with the contact portion of the calibration tool. At step 506, each of steps 500, 502, and 504 are repeated for each of a plurality of contact positions within the bonding location, thereby determining z-axis position data including the z-axis height values for each of the plurality of contact positions. For example, referring to FIG. 4A, each of steps 500, 502, and 504 may be repeated for each of positions 306a, 306b, 306c, 306d, 306e, and 306f within bonding location 306. After the z-axis height values have been determined for each of the positions (a "Yes" at step 506) then the process moves to step 508—if not (a "No" at step 506), the process is repeated (steps 500, 502, and 504).

At step 508, each of steps 500, 502, 504, and 506 are repeated for each of a plurality of bonding locations, thereby determining z-axis position data for each of the plurality of bonding locations. For example, referring to FIG. 3, each of steps 500, 502, 504, and 506 may be repeated for each of the plurality of bonding locations 306. After the z-axis position data has been determined for each of the bonding locations (a "Yes" at step 508) then the process moves to step 510—if not (a "No" at step 508), the process is repeated (steps 500, 502, 504, and 506).

The z-axis position data for each of the bonding locations may then be analyzed. That is, the z-axis position data may be processed to determine a level of parallelism for each of the bonding locations, and if that level of parallelism meets predetermined criteria through analysis of the z-axis position data. At step 510, a determination is made as to whether the z-axis position data for each of the bonding location meets predetermined criteria (e.g., using a computer system of the bonding machine). If the predetermined criteria is met, the process may be considered complete.

Of course this determination (of step 510) may be made using various different techniques. In one example, a computer system may accomplish step 510 by determining if each of the z-axis height values (included in the z-axis position data for a given bonding location) is within a predetermined tolerance of each other. An exemplary acceptable tolerance range is 2 microns. In a second example, a computer system may accomplish step 510 using software to generate a best fit plane for the bonding location using the z-axis position data for the bonding location. Then, a determination is made as to whether the best fit plane for each bonding location falls within an acceptable range of criteria. An exemplary acceptable range of criteria may be defined by one or more slope values (e.g., a slope per unit length along the best fit place, etc.). Of course, other techniques for making the determination of step 510 are contemplated.

In accordance with certain exemplary embodiments of the present invention, in the event that the z-axis position data does not meet the predetermined criteria (e.g., as described above in connection with step 510) a closed loop process may be used to make a system adjustment. Such an adjustment may be manual (i.e., requiring operator intervention) or automatic (i.e., an adjustment made automatically without operator intervention). At step 512, at least one of the bonding tool and the support structure is adjusted if the z-axis position data for at least one bonding location does not meet the predetermined criteria. An exemplary adjustment at step 512 may be a change to an orientation of a contact portion of the bonding tool. For example, the orientation of the contact portion of the bonding tool may be changed by unlocking an adjust mechanism of the bonding tool (e.g., an active or passive tilt adjust mechanism, such as an air bearing system), changing the bonding tool contact portion orientation (e.g., by changing the height or angle at a corner of the bonding tool contact portion based on an error as determined by the computer system of the bonding machine), and then relocking the adjust mechanism. Another exemplary adjustment at step 512 may be a change in the support structure mounting (e.g., a change in one corner of the support structure). Of course, other adjustments are contemplated. After step 512, the process may optionally repeat (returning back to step 500) in order to determine if the z-axis position data for each of the bonding locations meet the predetermined criteria—that is, to determine if the adjustment had the intended result. The process may repeat (with multiple adjustments) until the predetermined criteria are met.

Figure 6:
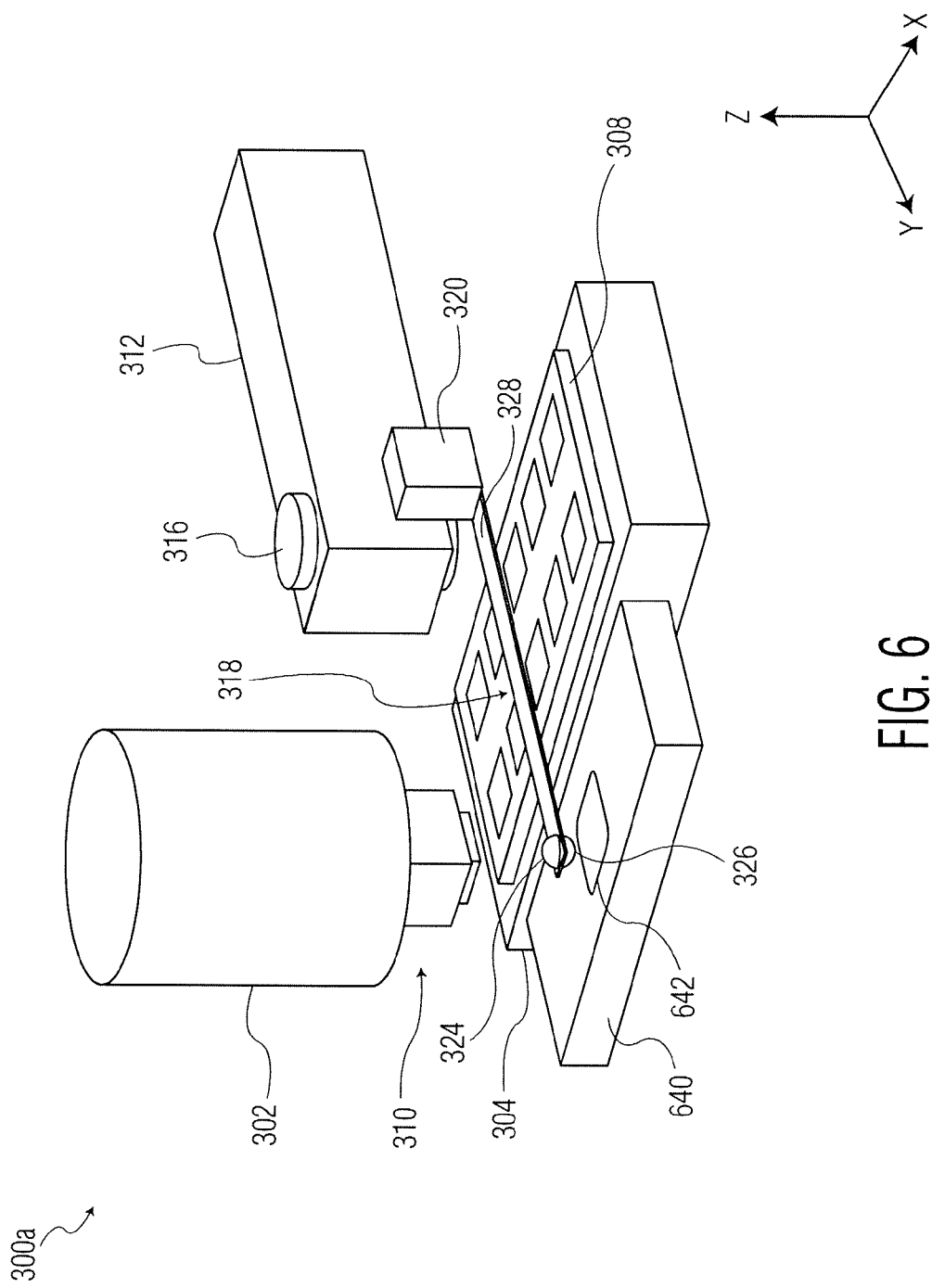
FIG. 6 is a block diagram perspective view of elements of yet another bonding machine in accordance with yet another exemplary embodiment of the present invention.

FIG. 6 illustrates elements of bonding machine 300a (which is substantially similar to bonding machine 300 of FIG. 3, except as explained below). Bonding machine 300a includes flux station 640 configured to provide flux material (from a contact region of fluxing cavity 642) to solder contacts of semiconductor elements prior to bonding of a semiconductor element to a substrate. For example, referring to FIG. 1A, solder contact portions 136 (of upper conductive structures 138a, 138b) on semiconductor element 132 may be "fluxed" by bringing them into contact with the flux material in fluxing cavity 642. After this fluxing, upper conductive structures 138a, 138b are brought into contact with, and thermocompressively bonded to, lower conductive structures 144a, 144b (e.g., see FIG. 1B). In connection with such a fluxing operation (and the subsequent bonding operation)—it may be desirable to determine (and perhaps adjust) the level of parallelism between fluxing cavity 642 and bonding tool 310. This may be accomplished using calibration tool 318, in a manner substantially similar to the technique shown in FIGS. 4B-4D. More specifically, a contact portion of bonding tool 310 is lowered into contact with contact portion 322, and drives contact portion 322 into contact with a location within flux cavity 642. A z-axis height value is obtained at this location (e.g., using a z-axis encoder). This process may be repeated for a plurality of x and y-axis locations within fluxing cavity 642. As will be appreciated by those skilled in the art, depending upon the size of the semiconductor elements being bonded, only a portion of fluxing cavity 642 may be utilized during a fluxing operation. This portion of fluxing cavity 642 may be referred to as a "contact region".

FIG. 7 illustrates a method of determining a level of parallelism between a contact portion of a bonding tool and a contact region of a flux station of a bonding machine. At step 700, a contact portion of a calibration tool is positioned between a bonding tool and a contact region of the flux station (e.g., where an exemplary contact region is within fluxing cavity 642 shown in FIG. 6). For example, in FIG. 6, contact portion 322 (not shown in FIG. 6) has been positioned (using motion system 312, which travels along the x-axis and y-axis, independent of bond head assembly) between bonding tool 310 and a contact region of fluxing cavity 642. At step 702, the bonding tool is lowered (in a manner similar to that shown in FIGS. 4B-4D, but with respect to a flux station) to drive the contact portion of the calibration tool to a contact position within the contact region of the flux station. In this contact position, upper contact portion 324 of the calibration tool contacts the contact portion of the bonding tool, and lower contact portion 326 contacts the contact position within the contact region of fluxing cavity 642 simultaneously. At step 704, a z-axis height value is determined for the contact position within the contact region of the fluxing cavity of the flux station.

At step 706, each of steps 700, 702, and 704 are repeated for each of a plurality of contact positions within the contact region of the flux station, thereby determining z-axis position data (including the z-axis height values) for the contact region of the flux station. After the z-axis position data has been determined (a "Yes" at step 706) then the process moves to step 708—if not (a "No" at step 706), the process is repeated (steps 700, 702, and 704). The z-axis position data for the contact region may then be analyzed. That is, the z-axis position data may be processed to determine a level of parallelism for the contact region, and if that level of parallelism meets predetermined criteria through analysis of the z-axis position data. At step 708, a determination is made as to whether the z-axis position data for the contact region of the flux station meets predetermined criteria (e.g., using a computer system of the bonding machine). If the predetermined criteria is met, the process may be considered complete.

This determination (of step 708) may be made using various different techniques. In one example, a computer system may accomplish step 708 by determining if each of the z-axis height values (included in the z-axis position data for the contact region) is within a predetermined tolerance of each other. An exemplary acceptable tolerance range is 2 microns. In a second example, a computer system may accomplish step 708 using software to generate a best fit plane for the contact region of the flux station. Then, a determination is made as to whether the best fit plane for the flux station falls within an acceptable range of criteria. An exemplary acceptable range of criteria may be defined by one or more slope values (e.g., a slope per unit length along the best fit place, etc.). Of course, other techniques for making the determination of step 708 are contemplated.

In accordance with certain exemplary embodiments of the present invention, in the event that the z-axis position data does not meet the predetermined criteria (e.g., as described above in connection with step 708) a closed loop process may be used to make a flux station adjustment. Such an adjustment may be manual (i.e., requiring operator intervention) or automatic (i.e., an adjustment made automatically without operator intervention). At step 710, the contact region of the flux station is adjusted if the z-axis position data (for at least one location) does not meet the predetermined criteria. An exemplary adjustment at step 710 may be a change in the contact region mounting (e.g., a change in one corner of flux cavity 642 shown in FIG. 6). Of course, other adjustments are contemplated. After step 710, the process may optionally repeat (returning back to step 700) in order to determine if the z-axis position data for each of the bonding locations meet the predetermined criteria—that is, to determine if the adjustment had the intended result. The process may repeat (with multiple adjustments) until the predetermined criteria are met.

The various processes described herein (e.g., the processes described in connection with FIGS. 5 and 7) may be performed at any desired interval. For example, such processes may be performed at machine set-up, any time a new application specific support structure (e.g., a p-part) is installed on the machine, at a predetermined interval (e.g., a predetermined time period, a predetermined number of bonds/operations), etc.

The exemplary machines and processes described herein (e.g., the processes described in connection with FIGS. 5 and 7) may be used to measure and then store the parallelism data (e.g., z-axis height values, z-axis position data, etc.). For example, such parallelism data may be stored in the memory of the bonding machine, and may be used later as an input to an adjustable system element (e.g., an adjustable bonding tool such as a repositionable tilt adjust bonding tool contact surface), either automatically or manually. Such an adjustment may be made with, or without, re-checking the parallelism data to determine if the adjustment achieved the desired result.

The exemplary machines and processes described herein may also be applied to a bond stage planarity (flatness) determination and/or adjustment. That is, it may be desirable to detect a level of planarity (flatness) of the bond stage (independent of bonding locations on an application specific support structure. For example, using the calibration tool described herein, a plurality of z-axis height measurements may be made at different positions of the bond stage to determine its overall planarity (flatness).

As will be appreciated by those skilled in the art, z-axis height values for the various methods described herein may be measured with respect to any of a number of positions. That is, the absolute z-height is not as important as the relative z-height measured from position to position, and from bonding location to bonding location. Those skilled in the art will appreciate the use of z-axis encoders in semiconductor packaging equipment (such as wire bonders) to obtain such z-axis height values.

As will be appreciated by those skilled in the art, in connection with certain exemplary embodiments of the present invention, accurate and repeatable detection of contact between certain elements is desired. For example, it may be desired to obtain z-axis position data when each of the bonding tool and the support structure is in contact with the contact portion of the calibration tool (e.g., see FIG. 4D). The detection of this contact may be achieved using any of a number of techniques, as will be understood by those skilled in the art. Such exemplary techniques include monitoring at least one bond head assembly characteristic such as a bond head assembly velocity, a bond head assembly force, and a bond head assembly z-axis position, amongst others. Such characteristics may be monitored instantaneously, or may be monitored over a period of time, in order to recognize a signature by which contact may accurately be declared. More specifically, in an example where a bond head assembly z-axis position is monitored to declare contact—after the bond head assembly reaches a z-axis position (and remains at such position in spite of a force being applied to move further along the z-axis) contact may be declared. In such an example, after contact is declared the bonding machine may be operated in a constant force mode for the retrieval of the z-axis position data. The constant force in the constant force mode may be provided using a z-axis motor of the bond head assembly, which may optionally be regulated using a force sensor providing feedback of an actual sensed force value.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bonding machine for bonding semiconductor elements, the bonding machine comprising:
    a support structure configured to support a substrate;
    a bond head assembly, the bond head assembly including
        a bonding tool configured to bond a plurality of semiconductor elements to the substrate; and
    a calibration tool including a contact portion configured to be positioned between the bonding tool and the support structure, the contact portion configured to be contacted by each of the bonding tool and the support structure simultaneously during a calibration operation,
    the contact portion of the calibration tool being moved by the bonding tool, and brought into contact with the support structure through movement of the bonding tool.

2. The bonding machine of claim 1 further comprising a motion system independent of the bond head assembly, the motion system carrying the calibration tool.

3. The bonding machine of claim 2 wherein the motion system is configured to move the calibration tool along each of an x-axis and a y-axis of the bonding machine.

4. The bonding machine of claim 2 wherein the motion system is configured to carry an optical assembly of the bonding machine.

5. The bonding machine of claim 1 wherein the contact portion of the calibration tool includes two opposing contact portions defining respective spherical surfaces.

6. The bonding machine of claim 1 wherein the calibration tool includes a beam portion, compliant in a z-axis direction, and configured to support the contact portion of the calibration tool.

7. The bonding machine of claim 1 wherein the bond head assembly is configured for movement in a y-axis, a z-axis, and a theta axis of the bonding machine.

8. The bonding machine of claim 1 wherein the support structure moves in an x-axis of the bonding machine.

9. The bonding machine of claim 1 wherein the contact portion of the calibration tool is configured to contact a plurality of bonding locations of the support structure to determine z-axis position data for each of the plurality of bonding locations.

10. The bonding machine of claim 9 wherein the z-axis position data for each of the plurality of bonding locations includes z-axis height values for a plurality of positions within respective ones of the plurality of bonding locations.

11. A bonding machine for bonding semiconductor elements, the bonding machine comprising:
    a support structure configured to support a substrate;
    a bond head assembly, the bond head assembly including
        a bonding tool configured to bond a plurality of semiconductor elements to the substrate;
    a calibration tool including a contact portion configured to be positioned between the bonding tool and the support structure, the contact portion configured to be contacted by each of the bonding tool and the support structure simultaneously during a calibration operation, the contact portion of the calibration tool being configured to contact a plurality of bonding locations of the support structure to determine z-axis position data for each of the plurality of bonding locations, the z-axis position data for each of the plurality of bonding locations including z-axis height values for a plurality of positions within respective ones of the plurality of bonding locations; and
    a computer system configured to receive the z-axis position data, and to determine if the z-axis position data for each of the plurality of bonding locations meets predetermined criteria.

12. The bonding machine of claim 11 wherein the computer system determines if the z-axis position data for each of the plurality of bonding locations meets the predetermined criteria by determining if each of the z-axis height values is within a predetermined tolerance of each other for each of the plurality of bonding locations.

13. The bonding machine of claim 11 wherein the computer system uses software to generate a best fit plane for each of the plurality of bonding locations using respective z-axis height values of each of the plurality of bonding locations.

14. The bonding machine of claim 13 wherein the computer system determines if the z-axis position data for each of the plurality of bonding locations meets the predetermined criteria by determining if each of the best fit plane falls within an acceptable range of criteria.

15. The bonding machine of claim 14 wherein the acceptable range of criteria is defined by one or more slope values.

16. The bonding machine of claim 11 wherein an adjustment is made to at least one of the bonding tool and the support structure if the computer system determines that the z-axis position data for at least one of the plurality of bonding locations does not meet the predetermined criteria.

17. The bonding machine of claim 16 wherein the adjustment includes a change to an orientation of a contact portion of the bonding tool.

18. The bonding machine of claim 17 wherein the orientation of the contact portion of the bonding tool is adjusted by unlocking an adjust mechanism of the bonding tool, changing the bonding tool contact portion orientation, and then relocking the adjust mechanism.

19. The bonding machine of claim 1 wherein the bonding machine is a thermocompression bonding machine.

20. The bonding machine of claim 1 further comprising a flux station configured to provide flux material to solder contacts of each of the plurality of semiconductor elements prior to bonding of each of the plurality of semiconductor elements to the substrate.

21. The bonding machine of claim 20 wherein a contact portion of the bonding tool is configured to contact a plurality of x-axis and y-axis locations of a contact region of the flux station to determine z-axis position data for the contact region.

22. The bonding machine of claim 21 wherein the z-axis position data for the contact region includes z-axis height values for the plurality of x-axis and y-axis locations of the contact region.

23. The bonding machine of claim 22 further comprising a computer system configured to receive the z-axis position data for the contact region, and to determine if the z-axis position data for the contact region meets predetermined criteria.

24. A bonding machine for bonding semiconductor elements, the bonding machine comprising:
a support structure configured to support a substrate;
a bond head assembly, the bond head assembly including a bonding tool configured to bond a plurality of semiconductor elements to the substrate; and
a calibration tool including a contact portion configured to be positioned between the bonding tool and the support structure, the contact portion configured to be contacted by each of the bonding tool and the support structure simultaneously during a calibration operation, the contact portion of the calibration tool including two opposing contact portions defining respective spherical surfaces.

* * * * *